United States Patent [19]
Baker

[11] 3,943,367
[45] Mar. 9, 1976

[54] HIGH FREQUENCY OPTICALLY COUPLED DIFFERENTIAL VOLTAGE PROBE WITH LOGARITHMIC RESPONSE

[75] Inventor: George H. Baker, Burke, Va.

[73] Assignee: The United States of America as represented by the Secretary of the Army, Washington, D.C.

[22] Filed: June 10, 1975

[21] Appl. No.: 585,737

[52] U.S. Cl.............. 250/551; 324/72.5; 324/96; 330/59; 250/209
[51] Int. Cl.².................................... G02B 27/00
[58] Field of Search............ 324/72.5, 96; 250/551, 250/552, 227; 330/59; 250/209

[56] References Cited
UNITED STATES PATENTS

| | | | |
|---|---|---|---|
| 3,621,390 | 11/1971 | Von Willisen | 324/96 |
| 3,629,590 | 12/1971 | Case | 250/551 X |
| 3,818,235 | 6/1974 | Johnson et al. | 250/551 |
| 3,820,023 | 6/1974 | Williams et al. | 324/72.5 X |
| 3,866,051 | 2/1975 | Shearer et al. | 250/551 |
| 3,893,037 | 7/1975 | Herbert | 330/59 |

*Primary Examiner*—Walter Stolwein
*Attorney, Agent, or Firm*—Nathan Edelberg; Robert P. Gibson; Saul Elbaum

[57] ABSTRACT

A voltage probe is provided for measuring high frequency transients during electromagnetic pulse simulator testing of electronic devices. A probe tip module including input terminals for receiving transient voltages, a differential amplifier producing a representative output voltage in response to the transients received and a lamp driver amplifier selectively driving one or another of a pair of light emitting diodes in logarithmic response to the output of the differential amplifier is coupled with the testing geometry. The light output of the diodes is coupled through two respective fiber optics devices to respective photodetector inputs of two signal channels which convert the photodetector outputs to suitable driving signals for a dual trace oscilloscope.

8 Claims, 1 Drawing Figure

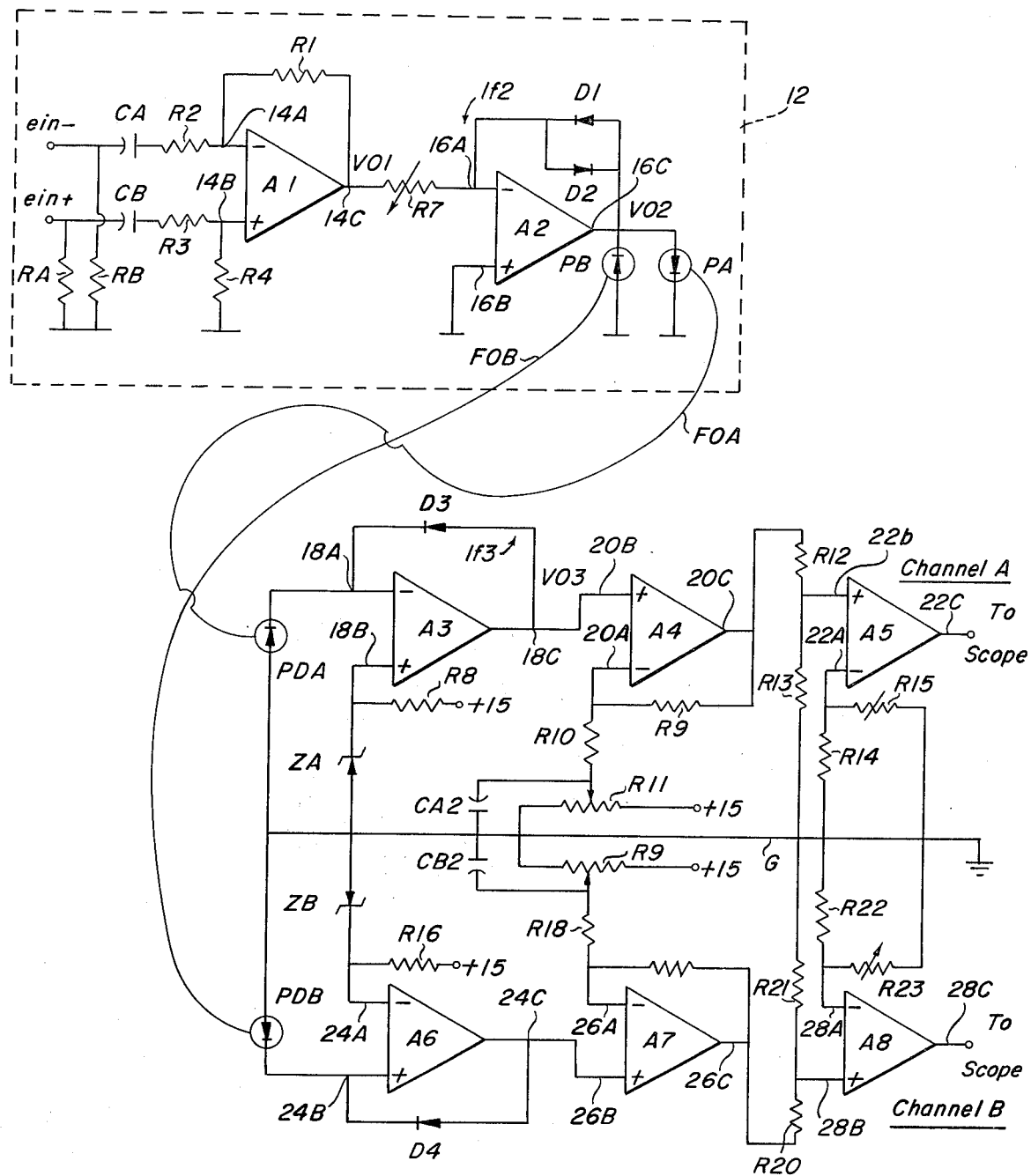

HIGH FREQUENCY OPTICALLY COUPLED DIFFERENTIAL VOLTAGE PROBE WITH LOGARITHMIC RESPONSE

The invention described herein may be manufactured, used and licensed by or for the United States Government for governmental purposes without the payment to me of any royalty thereon.

BACKGROUND OF THE INVENTION

In EMP (electro-magnetic pulse) simulator testing of defense electronics and the like, one of the parameters monitored is high frequency transient voltages. Problems have arisen with voltage probe devices utilized to monitor these transients due to EMP induced voltages on probe leads where remote sensors are employed to reduce the actual physical size of the portion of the probe in the EMP coupling geometry of the system under test.

Such small physical size and the remote sensor are desireable, however, to minimize the interaction between the probe and the coupling geometry.

It is, therefore, an object of the present invention to provide a new and novel differential voltage probe.

It is another object of the present invention to provide a new and novel voltage probe for measuring high frequency transients in EMP testing of electronic equipment which minimizes interaction with EMP coupling geometry and obviates the need for probe leads while providing minimum physical size of the probe.

Still another object of the present invention is to provide a new and novel minature high frequency, optically coupled, differential voltage probe device with logarithmic response characteristics.

These and other objects of the present invention will become more fully apparent with reference to the following specification and drawing which relate to a preferred embodiment of the invention.

BRIEF DESCRIPTION OF THE DRAWING

The drawing is a schematic circuit diagram of the voltage probe of the present invention.

SUMMARY OF THE INVENTION

A probe tip module including input terminals receiving transient voltages, a differential amplifier producing a representative output voltage in response to the transients received and a lamp driver amplifier selectively driving one or the other of a pair of GaAs light emitting diodes in logarithmic response to the output of the differential amplifier is coupled with the EMP testing geometry. The light output of the GaAs diodes is then coupled through two respective fiber optics devices to the respective photodetector inputs of two signal channels which convert the photodetector outputs to suitable driving signals for driving a dual trace oscilloscope or the like.

The invention thus provides a probe module with a minimum number of components to permit optimum minaturization optically coupled to a remote sensor and driver network for causing the display of the sensed values on a suitable oscilloscope or the like.

DETAILED DESCRIPTION OF THE INVENTION

Referring in detail to the drawing, input voltage signals ein− and ein+ are received at first and second input terminals 10A and 10B, respectively, of a probe module 12. The respective input terminals 10A and 10B are connected to ground through respective resistors RA and RB which may be, for example, 1 megohm in value, and are thence connected to the input terminals 14A and 14B of a differential amplifier A1 through coupling capacitors CA and CB and coupling resistors R2 and R3, respectively, in series with those capacitors. Exemplary values for the capacitors CA and CB are 1 picofarad and for the resistors R2 and R3, 1 megohm.

The output terminal 14C of the differential amplifier A1 is coupled to the first input terminal 14A through a feedback resistor R1; and the second input terminal 14B is connected to ground through a resistor R4.

The output terminal 14C provides a voltage signal hereinafter designated $V_{o1}$ which is directed through a variable coupling resistor R7 to a first input terminal 16A of a lamp driver amplifier A2, the latter having a grounded second input terminal 16B.

The output terminal 16C of the driver amplifier A2 is connected through a parallel opposed diode feedback branch D1, D2, the diode D1 have its forward direction into the input terminal 16A and the diode D2 have its forward direction into the output terminal 16C.

This diode feedback branch D1, D2 results in a logarithmic output voltage VO2 at the output terminal 16C which will be hereinafter described in detail.

The output terminal 16C is connected to ground through a pair of GaAs photoemitters PA and PB having their forward directions into ground and the output terminal 16C, respectively.

These photoemitters PA and PB selectively conduct when ein−>ein+ and ein+>ein−, respectively, as will be more fully described hereinafter.

The light outputs from the photoemitters PA and PB are respectively connected through fiber optics FOA and FOB to first and second silicon photodetectors PDA and PDB comprising the inputs to first and second signal channels A and B, respectively.

The probe module 12 is thus connected to the signal channels A and B through optical couplings, thereby eliminating metallic leads and precluding EMP induced signals on the connection between the probe module 12 and signal channels A and B.

A common ground lead G is provided for the signal channels A and B. The signal channel A comprises a photocurrent-to-voltage amplifier stage A3, and a pair of successive amplifier stages A4 and A5 which serve, respectively, to eliminate the d.c. component of the input stage A3 and a variable gain buffer amplifier to drive an oscilloscope or the like. The signal channel B comprises a photocurrent-to-voltage amplifier A6 with successive amplifier stages A7 and A8 which are counterparts of the amplifier stages A4 and A5, respectively, of channel A.

The input amplifier A3 includes first and second input terminals 18A and 18B and an output terminal 18C (18A being the negative and 18B being the positive terminal). The output terminal 18C is connected to the first input terminal 18A through a feedback diode D3 having its forward direction into the first input terminal 18A. The second input terminal 18B is connected through a resistor R8 (exemplary value 10K) to a source of positive bias (exemplary value +15V) as well as to the common ground lead G through a Zener diode AZ (exemplary rating 5.6V). The circuit to the input stage A3 is completed by the first photodetector PDA connected between the common ground lead G and the first input terminal 18A with the forward direction of the said photodetector PDA into the said first input terminal 18A.

An output voltage VO3 appears at the output terminal 18C of the input stage A3 and is directly coupled to the positive input terminal 20B of the amplifier stage A4, the latter also including a negative input terminal 20A and an output terminal 20C. The output terminal 20C is connected to the negative input terminal 20A through a feedback resistor R9. The negative input terminal 20A is in turn connected through a resistor to R10 to the variable tap of a potentiometer R11 (exemplary value 10K) and through a capacitor CA2 to the common ground lead G. The The potentiometer R11 is connected at one end to the common ground lead G and at its other end to a source of positive bias (exemplary value +15V).

The output 20C of the amplifier A4 is connected to the positive input terminal 22B of the buffer amplifier A5 through a coupling resistor R12, the said positive input terminal also being connected through a resistor R13 to the common ground lead G. The negative input terminal 22A of the buffer amplifier A5 is connected to the common ground lead G through a fixed resistor R14 (exemplary value 2K) and a parallel variable resistor R15 (exemplary maximum value 20K) to provide selective gain control for the said buffer amplifier A5.

The output terminal 22C of the buffer amplifier A5 comprises the ultimate output for signal channel A and is adapted for connection to an appropriate input of a dual trace oscilloscope or the like.

The signal channel B is a mirror image of the circuits of channel A.

The input stage A6 of channel B is a photocurrent-to-voltage amplifier having a negative input terminal 24A, a positive input terminal 24B and an output terminal 24C, the latter being connected through a feedback diode D4 to the positive input terminal 24B with the forward direction of the said feedback diode D4 into the said positive input terminal 24B.

The negative input terminal 24A is connected through a resistor R16 (exemplary value 10K) to a source of positive bias (exemplary value +15V) as well as to the common ground lead G through a Zener diode ZB (exemplary rating 5.6V). The circuit to the input stage A6 is completed by the second photodetector PDB connected between the common ground lead G and the positive input terminal 24B with the forward direction of the said photodetector PDB into the said positive input terminal 24B.

The output terminal 24C directly drives the positive input terminal 26B of the amplifier stage A7, the latter also including a negative input terminal 26A and an output terminal 26C. The output terminal 26C is connected to the negative input terminal 26A through a feedback resistor R17. The negative input terminal 26A is in turn connected through a resistor R18 to the variable tap of a potentiometer R19 (exemplary value 10K) and through a capacitor CB2 to the common ground lead G. The potentiometer R19 is connected at one end to a source of positive bias (exemplary value +15V) and at its other end to the common ground lead G.

The output 26C of the amplifier A7 is connected to the positive input terminal 28B of a buffer amplifier A8 through a coupling resistor R20, the said positive input terminal 28B also being connected through a resistor R21 to the common ground lead G. The negative input terminal 28A of the buffer amplifier A8 is connected to the common ground lead G through a fixed resistor R22 (exemplary value 2K) and a parallel variable resistor R23 (exemplary maximum value 20K) to provide selective gain control for the said buffer amplifier A8.

The output terminal 28C of the buffer amplifier A8 comprises the ultimate output for signal channel B and is adapted for connection to an appropriate input of a dual trace oscilloscope or the like in conjunction with the output of channel A.

OPERATION OF THE INVENTION

The input amplifier A1 of the probe module 12 is a high impedance differential amplifier producing the output voltage $V_{o1}$ as follows:

$$V_{o1} = A\ (e_{in+} - e_{in-})$$

where $$A = R_1/R_2 = R_4/R_3$$

The lamp driver amplifier A2 provides the logarthmic output voltage $V_{o2}$ as follows:

The voltage V across the parallel opposed diode branch D1, D2 is $$V = kT/e\ \log\ I_t/I_o\ \text{for}\ I \gg I_o$$

where
$I_t$ = total current through the diode pair D1, D2
$I_o$ = current in the reverse biased diode D3
$k$ = Boltzman constant
$T$ = Temperature °K
$e$ = charge on an electron Therefore, the voltage $V_{o2}$ can be defined as $$V_{o2} = kT/e\ \log\ (I_{f2}/I_o)$$

where (where $I_{f2}$ is the feedback current into the negative input terminal 16A).

$$= \frac{kT}{e} \log \left( \frac{V_{o1}/R_7}{I_o} \right)$$

$$= \frac{kT}{e} \log \frac{A\ (e_{in+} - e_{in-})}{R_7 I_o}$$

Now, since the output intensity (Pout) of the GaAs photoemitters PA and PB is proportional to their respective junction currents $(I_d)$ i.e., Pout $\alpha\ I_d$, and $$I_d = I_o \left[ \exp\left(\frac{eV_{o2}}{kT}\right) - 1 \right]$$

$$= I_o \left[ \exp\left(\frac{e}{kT} \cdot \frac{kT}{e} \log \frac{A\ e_{in+} - e_{in-}}{R_7 I_o}\right) - 1 \right]$$

then:

Pout $\alpha\ I_d = A/R_7\ (e_{in+} - e_{in-}) - I_o$

The photoemitter PA will conduct when $e_{in-} > e_{in+}$.
The photoemitter PB will conduct when $e_{in+} > e_{in-}$.
Excitation of one of the photoemitters PA, PB results in excitation of a respective one of the photodetectors PDA, PDB by the light output of the former being transmitted through a respective one of the fiber optics FOA, FOB.

Since channel A and channel B perform identically, it will be assumed that $e_{in-} > e_{in+}$ and that the photoemitter PA and photodetector PDA are energized as a result, causing a voltage $V_{o3}$ to appear at this output terminal 18C of the photocurrent-to-voltage amplifier A3. In further reference to the Zener diode ZA, this serves to back bias the photodetector PDA to improve the response time of the latter. Now, since the feedback diode D3 provides for a logarithmic response, the output voltage $V_{o3}$ can be expressed as follows:

$$V_{o3} = \frac{kT}{e}\log\left(\frac{I_{f3}}{I_o}\right) + V_z$$

$$= \frac{kT}{e}\log I_{f3} + \left(\frac{-kT}{e}\log I_o + V_z\right)$$

where the parenthetical portion of the latter equation is a constant d.c. term. It is this d.c. component that is removed by the succeeding stage A4.

In the foregoing equation $I_{f3}$ is the current through the feedback diode D3; $V_z$ is the Zener diode voltage; and $I_o$ is the diode saturation current.

The output current of the photodetector PDA is proportional to the light intensity of the photoemitter PA which in turn is proportional to the voltage difference $(e_{in+} - e_{in-})$ at the inputs 10A, 10B the probe module 12.

The output of the buffer stage A5 is thus proportional to the logarithm of the voltage difference $(e_{in+} - e_{in-})$ sensed at the inputs 10A, 10B of the probe module 12 and can be controlled in magnitude for calibration purposes by adjusting the gain.

The photodetectors PDA, PDB comprise remote sensors and the signal channels A, B logarithmic amplifiers optically and remotely coupled to the probe module 12.

This permits the probe module 12 to be contained a small shielded package of a volume less than one cubic inch whereby the interaction of the probe with EMP coupling geometry of the system under test can be minimized.

I claim:

1. Differential voltage probe means comprising:
   a probe module having positive and negative voltages input terminals, differential amplifier and driver circuit means providing voltage output signals as a function of the logarithm of the voltage differences at said input terminals, and first and second light emitting means selectively driven by said circuit means as function of the relative magnitudes of the respective voltages at said input terminals and providing first and second light outputs of intensities proportional to the said voltage differences;
   a dual channel amplifier means comprising first and second photodetector means responsive to the light outputs of said first and second light emitting means, respectively, each photodetector means serving as an input sensor for a respective one of said channels and providing first and second current inputs, respectively, proportional to said first and second light outputs, and first and second current-to-voltage and buffer circuit means comprising said dual channels energized in respective response to said first and second light emitting means for providing output signals proportional to the said voltage differences sensed by said probe module; and
   optical coupling means connecting said first and second light outputs of said first and second light emitting means to said first and second photodetector means, respectively.

2. The invention defined in claim 1, wherein, said first optical coupling means comprises first and second fiber optic means connected, respectively, between said first light emitting means said first photodetector means and said second light emitting means and said second photodetector means.

3. The invention defined in claim 1, wherein said differential amplifier and driver circuit means comprises a differential amplifier responsive to said input voltages and providing a differential voltage output representative thereof;
   a driver amplifier, having an input driven by said differential voltage output, an output terminal, and an opposed parallel diode feedback path connected from said input to said output terminal; and
   said light emitting means comprises first and second parallel opposed light emitting diodes driven by said output terminal.

4. The invention defined in claim 3, wherein said optical coupling means comprises first and second fiber optic means connected, respectively between said first light emitting means said first photodetector means and said second light emitting means and said second photodetector means.

5. The invention defined in claim 1, wherein said amplifier and buffer circuit means in each channel of said dual channel amplifier means comprises:
   first amplifier means responsive to the photocurrent output of a said photodetector means providing a first proportional output voltage;
   second amplifier means driven by said proportional output voltage for removing direct current components therefrom and providing a second proportional output voltage; and
   third amplifier means responsive to said second proportional output voltage for providing an output driver signal proportional to the logarithm of said differential voltage measure by said probe.

6. The invention defined in claim 5, wherein said optical coupling means comprises first and second fiber optic means connected, respectively between said first light emitting means said first photodetector means and said second light emitting means and said second photodetector means.

7. The invention defined in claim 5, wherein said differential amplifier and driver circuit means comprises a differential amplifier responsive to said input voltages and providing a differential voltage output representative thereof;
   a driver amplifier, having an input driven by said differential voltage output, an output terminal, and an opposed parallel diode feedback path connected from said input to said output terminal; and
   said light emitting means comprises first and second parallel opposed light emitting diodes driven by said output terminal.

8. The invention defined in claim 7, said optical coupling means comprises first and second fiber optic means connected, respectively between said first light emitting means said first photodetector means and said second light emitting means and said second photodetector means.

* * * * *